US012651879B2

(12) United States Patent (10) Patent No.: US 12,651,879 B2
Olson et al. (45) Date of Patent: Jun. 9, 2026

(54) WATT-HOUR METER BLADE

(71) Applicant: E.J. Brooks Company, Novi, MI (US)

(72) Inventors: Justin A Olson, Flat Rock, MI (US);
David K Gill, Ortonville, MI (US)

(73) Assignee: E.J. Brooks Company, Novi, MI (US)

( * ) Notice: Subject to any disclaimer, the term of this
patent is extended or adjusted under 35
U.S.C. 154(b) by 5 days.

(21) Appl. No.: 17/308,196

(22) Filed: May 5, 2021

(65) Prior Publication Data

US 2022/0166176 A1 May 26, 2022

Related U.S. Application Data

(60) Provisional application No. 63/117,147, filed on Nov.
23, 2020.

(51) Int. Cl.
*H01R 33/76* (2006.01)
*H01R 13/11* (2006.01)
*H01R 43/16* (2006.01)
*G01R 21/00* (2006.01)

(52) U.S. Cl.
CPC ......... *H01R 33/765* (2013.01); *H01R 13/112*
(2013.01); *H01R 43/16* (2013.01); *G01R*
*21/00* (2013.01)

(58) Field of Classification Search
None
See application file for complete search history.

(56) References Cited

U.S. PATENT DOCUMENTS

| | | | | |
|---|---|---|---|---|
| 4,274,700 A | * | 6/1981 | Keglewitsch | H01R 4/028 |
| | | | | 439/682 |
| 5,006,076 A | | 4/1991 | Robinson et al. | |
| 5,385,486 A | | 1/1995 | Robinson et al. | |
| 5,586,913 A | * | 12/1996 | Robinson | H02B 1/03 |
| | | | | 361/640 |
| 5,595,506 A | | 1/1997 | Robinson et al. | |
| 6,059,605 A | | 5/2000 | Robinson et al. | |
| 6,325,666 B1 | | 12/2001 | Robinson et al. | |
| 6,488,535 B1 | | 12/2002 | Robinson et al. | |
| 6,589,072 B2 | | 7/2003 | Robinson et al. | |
| 7,347,722 B2 | * | 3/2008 | Zhang | G01R 11/04 |
| | | | | 439/858 |
| 8,475,184 B2 | * | 7/2013 | Hasegawa | H01R 13/112 |
| | | | | 439/345 |
| 8,717,007 B2 | | 5/2014 | Banhegyesi | |

OTHER PUBLICATIONS

Definition of rectangular from the Cambridge Advanced Learner's
Dictionary & Thesaurus © Cambridge University Press, retrieved
Dec. 2023.*

* cited by examiner

*Primary Examiner* — Felix O Figueroa
(74) *Attorney, Agent, or Firm* — Dickinson Wright PLLC;
Andrew D. Dorisio

(57) ABSTRACT

A watt-hour meter block adapter assembly includes a hous-
ing. The watt-hour meter block adapter assembly includes a
blade supported by the housing. The blade includes a blade
end and a jaw end. The blade includes a middle portion that
extends from the blade end to the jaw end. The middle
portion and blade end are rectangular in cross-section. An
area of the rectangular cross-sectional area of the middle
portion is greater than an area of the rectangular cross-
sectional area of the blade end.

13 Claims, 7 Drawing Sheets

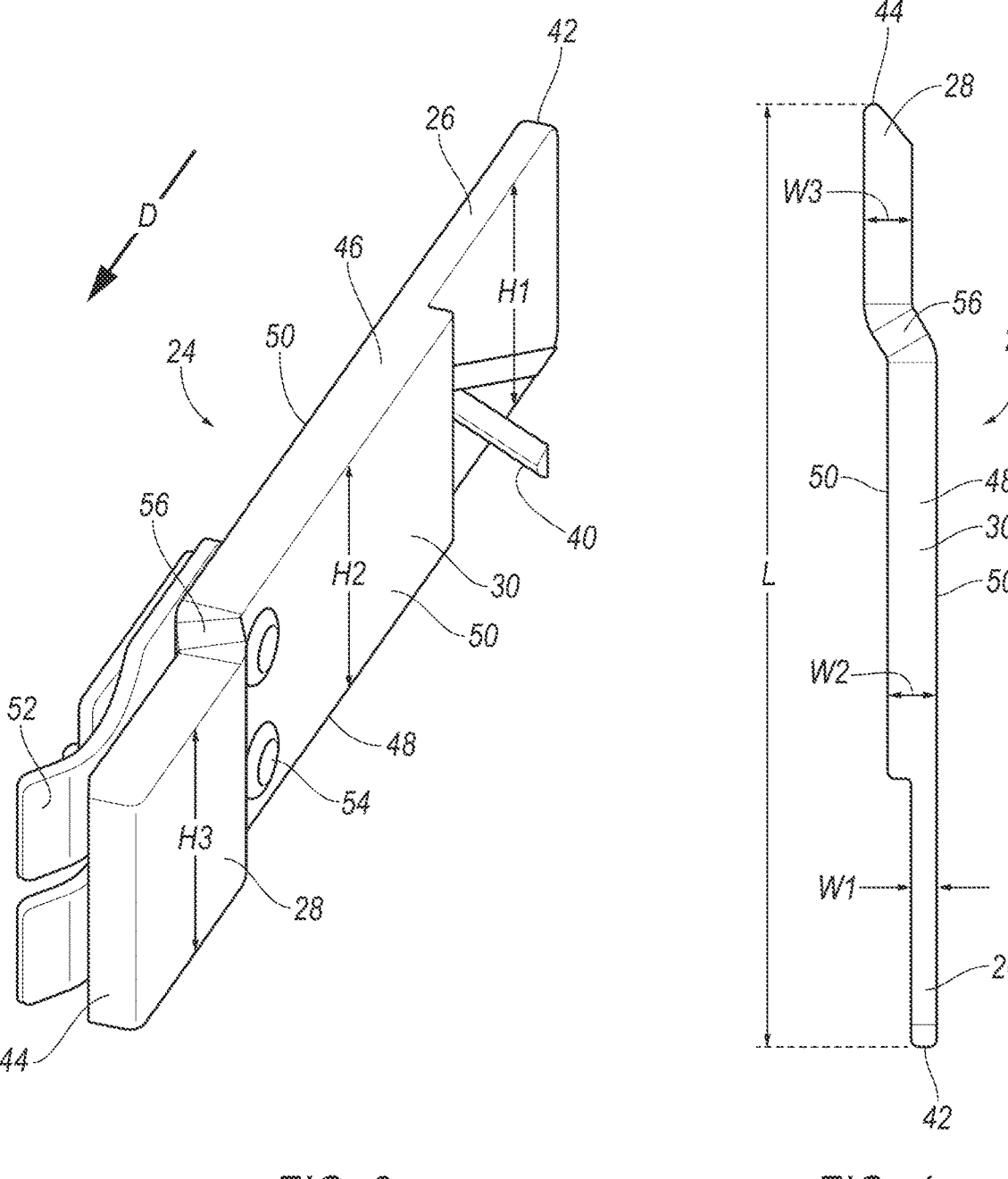
*FIG. 3*            *FIG. 4*

WATT-HOUR METER BLADE

CROSS-REFERENCE TO RELATED APPLICATIONS

The subject patent application claims priority to and all the benefits of Provisional Patent Application U.S. 63/117, 147 filed on Nov. 23, 2020 and incorporated herein by reference in its entirety.

BACKGROUND

Watt-hour meters are employed by electrical utility companies to measure and record energy consumption at residential and commercial building sites. A conventional watt-hour meter is removably engaged to a meter block, which is usually mounted to the side of the building site. A power line from the utility power grid is connected to a line end of the meter block, and the building receives the appropriate amount of power through a load end of the meter block. A watt-hour meter block adapter may connect the watt-hour meter to the meter block such that any amount of electricity flowing from the line end to the load end is measured by the watt-hour meter.

BRIEF DESCRIPTION OF THE DRAWINGS

FIG. 3 is a perspective view of a blade for the watt-hour meter block adapter assembly.

FIG. 4 is a bottom view of the blade of FIG. 3.

DETAILED DESCRIPTION

Conventional meter block adapter assemblies have blades for connecting a meter block to a watt-hour meter. Early designs of such blades were made from strips of conductive material having a consistent cross-section area along a length of the blade. Later designs of such blades had center portions with a C-channel shaped cross-section. The C-channel shape provided increased performance of the meter block adapter assembly relative to early designs.

The C-channel shape of the blade is formed with a stamping operation that folds up elongated edges of a flat strip. The stamping operation may limit potential designs of the blade. For example, manufacturing facilities may require increasingly higher force presses to accommodate strips of material of increasing thickness. Additional stamping operations may be required to form other features of conventional blades.

A meter block adapter assembly disclosed herein provides increased performance compared to conventional designs. For example, the meter block adapter assembly disclosed herein has a relatively larger cross-sectional area of a blade compared to a blade end of the blade, and a relatively lower total surface area/cross section area ratio of such cross-section compared to a total surface area/cross section area ratio of the conventional C-channel blade with a same amount of cross-section area. These features may enable a relatively higher amperage rating of the meter block adapter assembly, e.g., relative to conventional designs having a same amount of blade material. These features may enable a relatively similar amperage rating of the meter block adapter assembly, e.g., relative to conventional designs and with less blade material than such designs. The relatively larger cross-sectional area of the blade and the relatively lower total surface area/cross section area ratio of such cross section enable the improved performance by providing enhanced current flow and heat distribution properties to the blade. For example, the rectangular cross-section of the blade disclosed herein may more readily transfer heat along a length of the blade, helping to maintain a temperature at ends of the blade within desired limits. The rectangular cross-section of the blade internally transfers heat faster any from the ends than a C-channel shaped blade having an equal cross-section area due the reduced total surface area.

The blade described herein may be manufactured by first extruding a blank having a profile that matches a profile of side surfaces of the blade. The extruded blank is then cut to provide a plurality of the blades. The extrusion and subsequent cutting steps may provide the blade without requiring any pressing, thereby eliminating the cost and limitations associated therewith.

Figure 1:
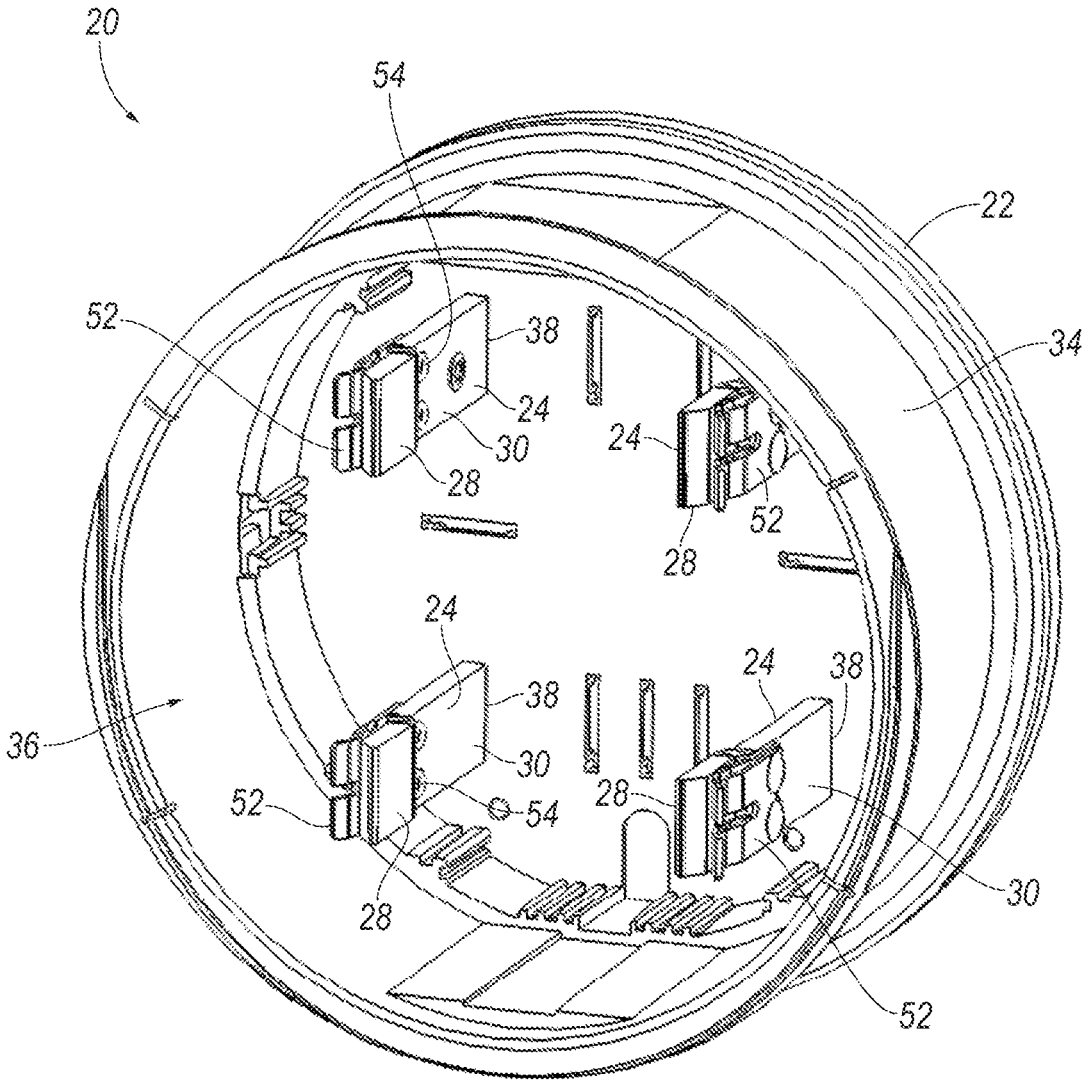
FIG. 1 is a perspective view of a watt-hour meter block adapter assembly.
Figure 2:
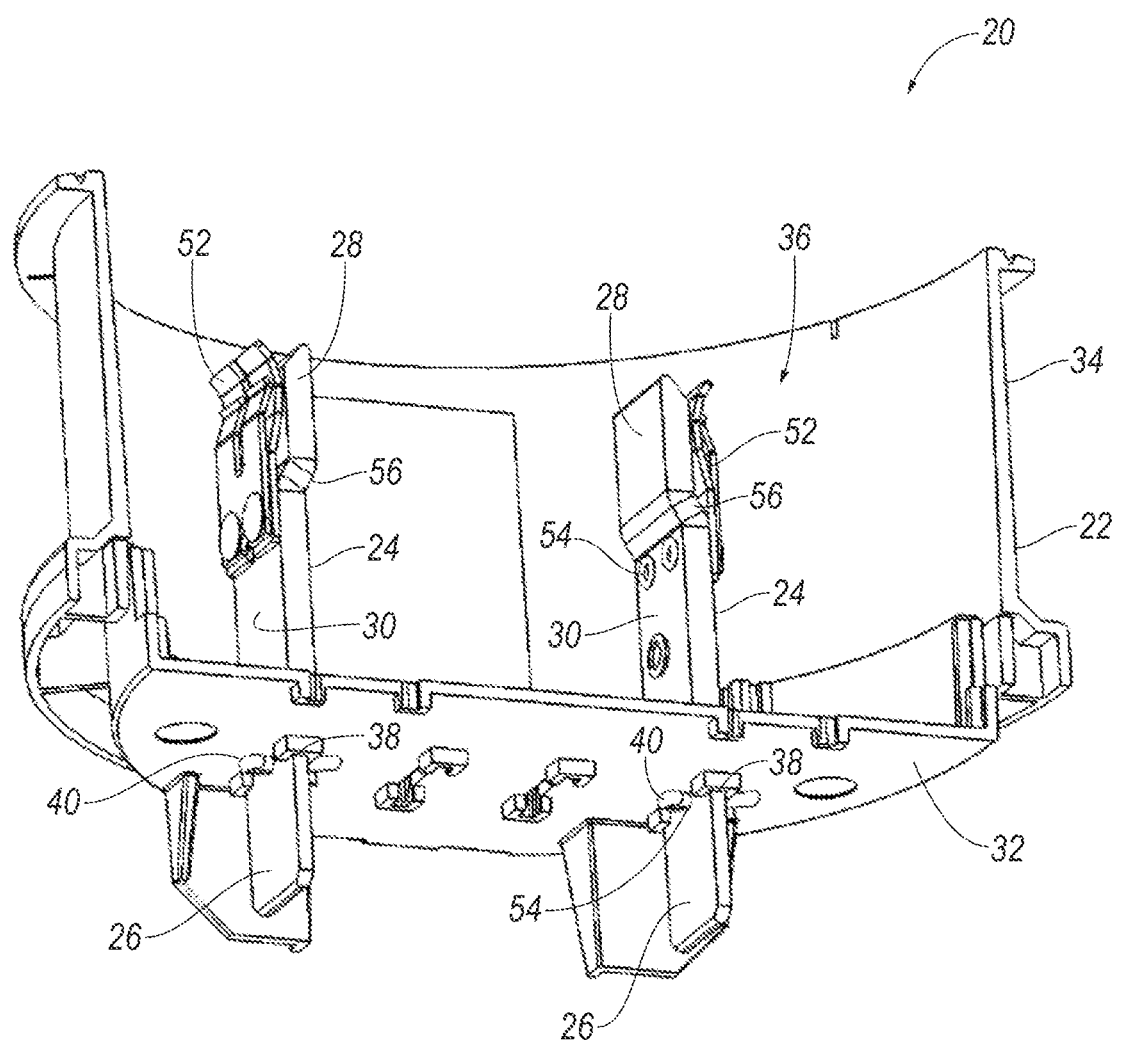
FIG. 2 is a cross-section perspective of the watt-hour meter block adapter assembly.

With reference to FIGS. 1 and 2, a watt-hour meter block adapter assembly 20 is shown. The meter block adapter assembly 20 may provide electrical communication between a meter block and a watt-hour meter (not shown). The meter block adapter assembly 20 includes a housing 22 that supports a plurality of blades 24. The blades 24 of the watt-hour meter block adapter assembly 20 provides the electrical connection between the meter block and the watt-hour meter via the blades 24. Each blade 24 includes a blade end 26 and a jaw end 28. Each blade 24 includes a middle portion 30 that extends from the blade end 26 to the jaw end 28. The middle portion 30 and blade end 26 are rectangular in cross-section. An area of the rectangular cross-sectional area of the middle portion 30 is greater than an area of the rectangular cross-sectional of the blade end 26.

The housing 22 supports and protects the blades 24. The housing 22 may partially surround the blades 24 and inhibit access thereto. For example, the housing 22 may include a base 32 and a shield 34 that enclose a volume 36. The blades 24 may be disposed within the volume 36. The housing 22, e.g., the base 32, may include slots 38. The blade ends 26 of the blades 24 may extend through the slots 38 from the inside the enclosed volume 36 to outside the enclosed volume 36. The housing 22, including the base 32 and the shield 34, may be plastic or any suitable material. Split pins 40, or other suitable structure, may retain the blades 24 within the slots 38.

The blades 24 conduct electricity between the meter block and the watt-hour meter. The blades 24 may be copper, or any suitable electrically conductive material. The blades 24 may each include tin plating. The tin plating may help protection against corrosion, e.g., of the copper of the blade 24.

Each blade 24 is elongated between a distal end surface 42 at the blade end 26 and a distal end surface 44 at the jaw end 28. Each blade 24 includes a top surface 46 and an opposing bottom surface 48. Each blade 24 includes pair of opposing side surfaces 50. The top surface 46 and the bottom surface 48 may each extend from the distal end surface 42 at the blade end 26 to the distal end surface 44 at the jaw end 28. The top surface 46 and the bottom surface 48 may each extend from one of the side surfaces 50 to the other side surface 50. The side surfaces 50 may each extend from one of the distal end surface 42 at the blade end 26 to the distal end surface 44 at the jaw end 28. The side surfaces 50 may each extend from the top surface 46 to the bottom surface 48.

With reference to FIG. 4, a length L of each blade 24 is defined by a distance between the distal end surfaces 42, 44.

With reference to FIGS. 3-7, widths W1, W2, W3 of each blade 24 are defined by a distance between the top surface 46 and the bottom surface 48, e.g., at the blade end 26, the middle portion 30, and the jaw end 28, respectively. Heights H1, H2, H3 of each blade 24 are defined by a distance between the side surfaces 50, e.g., at the blade end 26, the middle portion 30, and the jaw end 28, respectively.

The blade end 26 is designed to engage with the meter block. For example, the blade end 26 may be engaged, e.g., disposed within, a terminal of the meter block. The height H1 and the width W1 of the blade 24 at the blade end 26 may conform with one or more standards. The standard(s) may specify tolerances the height H1 and the width W1 of the blade end 26. For example, American National Standards (ANSI) C12.10 specifies that the blade end 26 has a width between 0.060 and 0.097 inches and a height less than 0.760 inches.

The blade end 26 is rectangular in cross-section in a plane that extends normal to a direction D of elongation of the blade 24, i.e., extending between the distal end surfaces 42, 44. The height H1 and the width W1 of the rectangular cross-section are defined by the top surface 46, the bottom surface 48, and the side surfaces 50 at the blade end 26. The rectangular cross-section of the blade end 26 defines an area. The area may be determined by multiplying the height H1 (the distance between the top surface 46 and the bottom surface 48) by the width W1 (the distance between the side surfaces 50).

The jaw end 28 is designed to engage with the watt-hour meter. For example, a jaw 52 may be fixed to the blade 24 at the jaw end 28. The jaw 52 may urge an object, such as a prong of the watt-hour meter, inserted between the jaw 52 and the jaw end 28 toward the jaw end 52. Compressing the prong between the jaw 52 and the jaw end 28 may provide support to the watt-hour meter and maintain the prong in contact with the jaw end 28. The jaw may be fixed at holes 54 of the blade 24, e.g., with a faster.

Figures 5, 6:
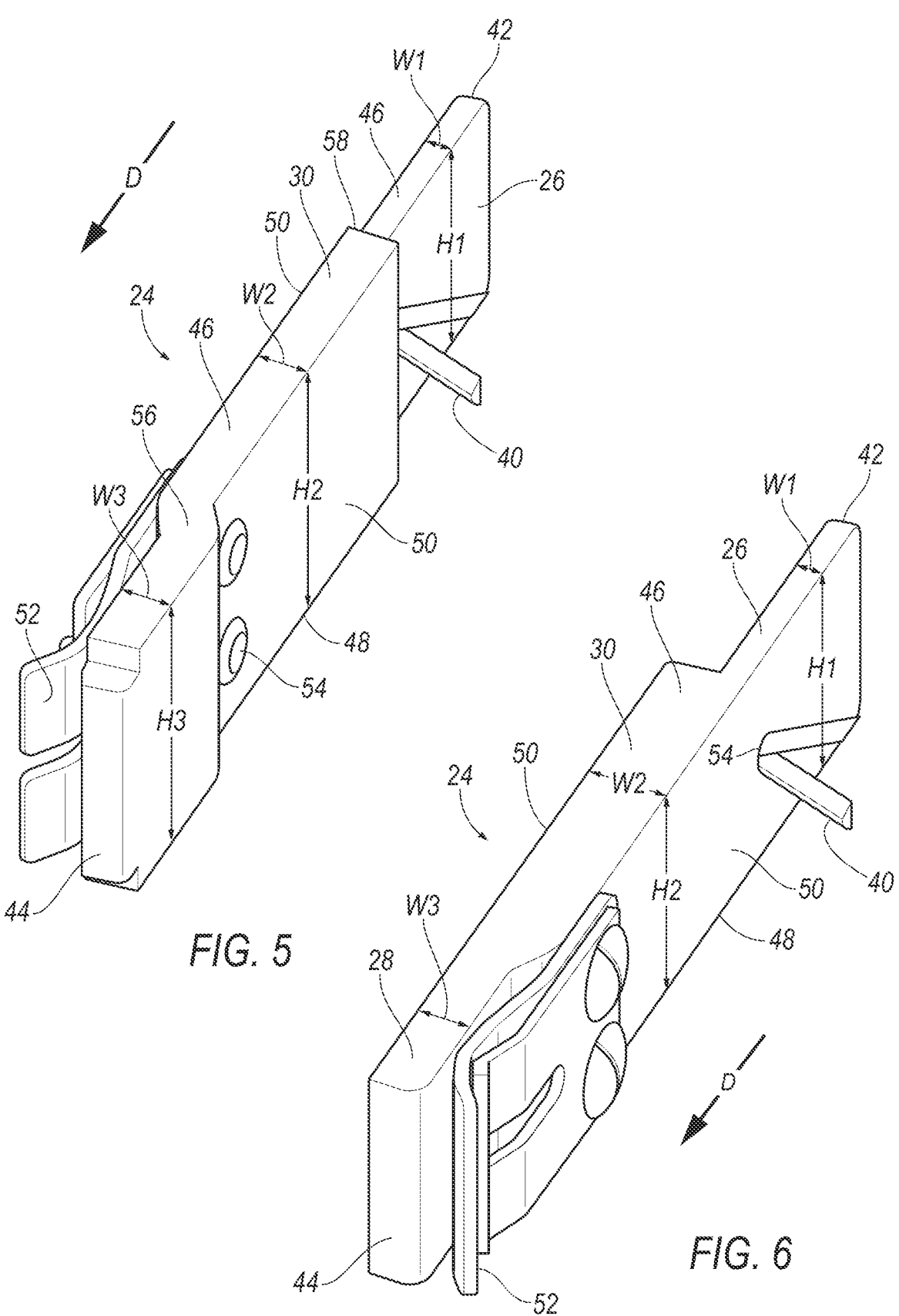
FIG. 5 is a perspective view of an alternate blade for the watt-hour meter block adapter assembly.
FIG. 6 is a perspective view of an alternate blade for the watt-hour meter block adapter assembly.
Figure 7:
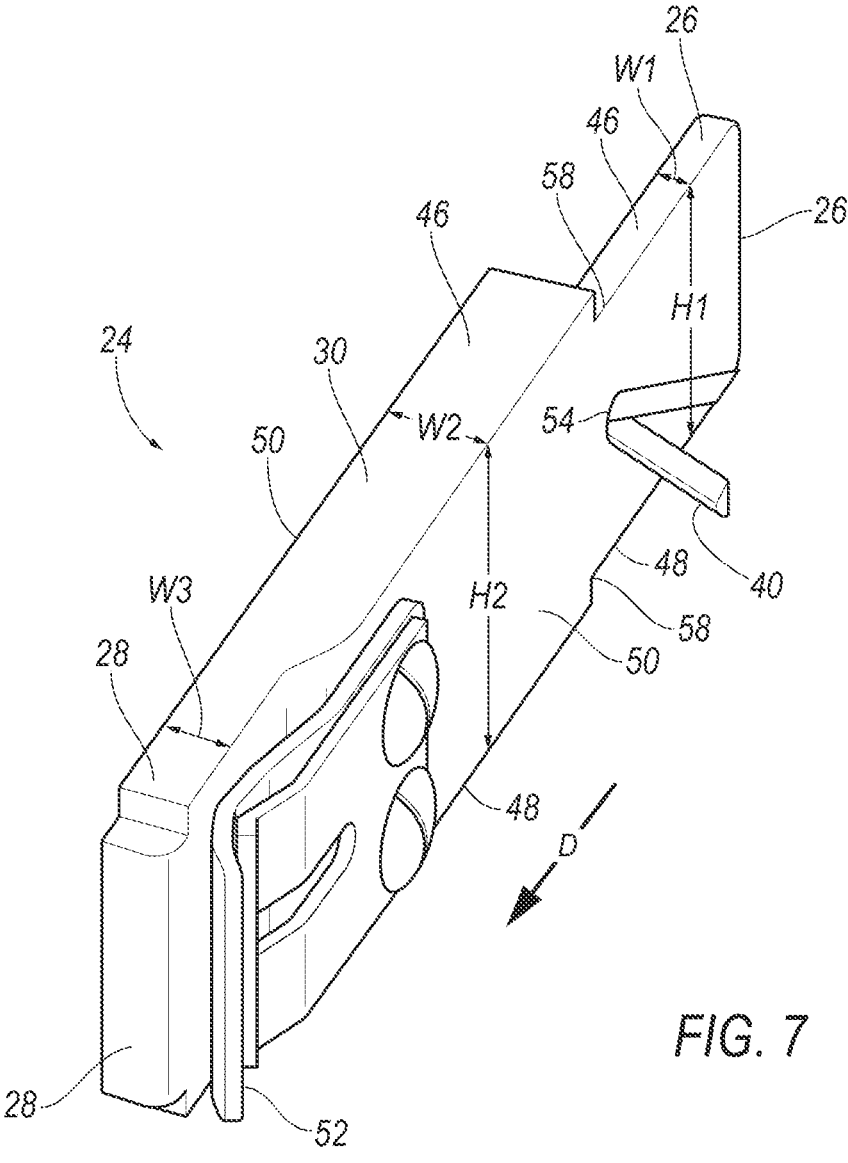
FIG. 7 is a perspective view of an alternate blade for the watt-hour meter block adapter assembly.

The jaw end 28 is rectangular in cross-section in a plane that extends normal to the direction D of elongation of the blade 24. The height H3 and the width H3 of the rectangular cross-section are defined by the top surface 46, the bottom surface 48, and the side surfaces 50 at the jaw end 28. The width W3 of the jaw end 28 may be greater than the width W1 of the blade end 26. The height H3 of the jaw end 28 may be equal to the height H1 of the blade end 26, as shown in FIGS. 3 and 6. The height H3 of the jaw end 28 may be greater than the height H1 of the blade end 26, as shown in FIGS. 5 and 7. The rectangular cross-section of the jaw end 28 defines an area (i.e., H3×W3). The area defined by the rectangular cross-section of the jaw end 28 is greater than the area defined by the rectangular cross-section of the blade end 26.

The middle portion 30 connects the blade end 26 to the jaw end 28. Electricity may flow from the blade end 26 to the jaw end 28 via the middle portion 30. For example, the jaw end 28, the blade end 26, and the middle portion 30 may be unitary, i.e., a single, uniform piece of material with no seams, joints, fasteners, or adhesives holding it together, i.e., formed together simultaneously as a single continuous unit, e.g., by extruding. Non-unitary components, in contrast, are formed separately and subsequently assembled, e.g., by threaded engagement, welding, etc. The top surface 46, the bottom surface 48, and the side surfaces 50 at the middle portion 30 may be planar, i.e., generally continuously flat.

The middle portion 30 is rectangular in cross-section in a plane that extends normal to the direction D of elongation of the blade 24. The height H2 and the width W2 of the rectangular cross-section are defined by the top surface 46, the bottom surface 48, and the side surfaces 50 at the middle portion 30. The width W2 of the middle portion 30 is greater than the width W1 of the blade end 26. The width W2 of the middle portion 30 may be generally equal to the width W3 of the jaw end 28, as shown in FIGS. 4 and 5. A jog 56 may connect the blade end 26 and middle portion 30 of equal width. The jog 56 enables the jaw end 28 to be laterally offset relative to the direction D of elongation of the blade 24, e.g., such that the prong of the watt-hour meter aligns with, e.g., is co-planar with, the blade end 26. The width W2 of the middle portion 30 may be greater than the width W3 of the jaw end 28, as shown in FIGS. 6 and 7.

The height H2 of the middle portion 30 may be equal to the height H3 of the jaw end 28. The height H2 of the middle portion 30 may be equal to the height H1 of the blade end 26, as shown in FIGS. 3 and 6. The height H2 of the middle portion 30 may be greater than the height H1 of the blade end 26, as shown in FIGS. 5 and 7. For example, a step 58 may connect the middle portion 30 and the blade end 26. The step 58 may position the blade 24 relative to the housing 22, e.g., the step 58 may abut the base 32.

The rectangular cross-section of the middle portion 30 defines an area (i.e., H2×W2). The area defined by the rectangular cross-section of the middle portion 30 is greater than the area defined by the rectangular cross-section of the blade end 26. The area defined by the rectangular cross-section of the middle portion 30 may be greater than the area defined by the rectangular cross-section of the jaw end 28. The area defined by the rectangular cross-section of the middle portion 30 may be equal to the area defined by the rectangular cross-section of the jaw end 28.

The larger area of the rectangular cross-section of the middle portion 30 and the jaw end 28 relative to the smaller area of the rectangular cross-section provides increased performance to the blade 24 and the watt-hour meter block adapter assembly 20. For example, the larger area of the rectangular cross-section of the middle portion 30 and the jaw end 28 may enable a higher rating of the watt-hour meter block adapter assembly 20, i.e., the watt-hour meter block adapter assembly 20 may be rated to carry an increased amperage relative to a smaller area of the rectangular cross-section of the middle portion 30 and/or the jaw end 28.

The blade 24 defines the total surface area. The total surface area is a sum of the areas of all external surfaces of the blade 24 that may radiate heat energy away from the blade.

Figure 9:
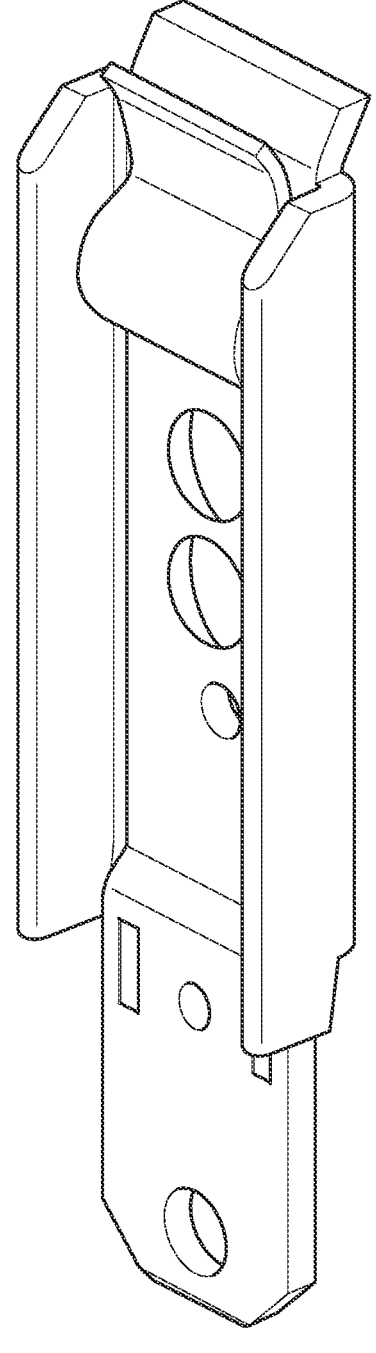
FIG. 9 is a perspective view of a conventional blade for the watt-hour meter block adapter assembly.

The total surface area and the area of the rectangular cross-section of the middle portion 30 define the total surface area/cross section area ratio, i.e., the total surface area divided by the area of the middle portion 30. The total surface area/cross section area ratio of the rectangular cross-section of the middle portion 30 may be less a total surface area/cross section area ratio of conventionally shaped cross-section having a same amount of cross section area. For example, the total surface area/cross section area ratio of the rectangular cross-section of the middle portion 30 for a certain amount of area may be less than a total surface area/cross section area ratio of a C-channel cross-section with an equal amount of area. The relatively lower total surface area/cross section area ratio of the rectangular cross-section of the middle portion 30 provides increased performance to the blade 24 and the watt-hour meter block adapter assembly 20. For example, an amperage rating of the rectangular cross-section of the middle portion 30 with a certain amount of area (and a lower total surface area/cross section area ratio) may be greater than an amperage rating of a C-channel cross-section with an equal amount of area (and a higher total surface area/cross section area ratio). The lower total surface area/cross section area ratio may increase the performance of the blade 24 by providing improved heat transfer and/or current flow characteristics. The total surface area/cross section area ratio for the middle portion 30 of a blade 24 having an ANSI C12.10 compliant blade end 26 (i.e., having a width between 0.060 and 0.097 inches and a height less than 0.760 inches) may be about 36:1. In contrast, the total surface area/cross section area ratio of a conventional C-channel blade (e.g., as shown in FIG. 9) is about 66:1.

Figure 8:
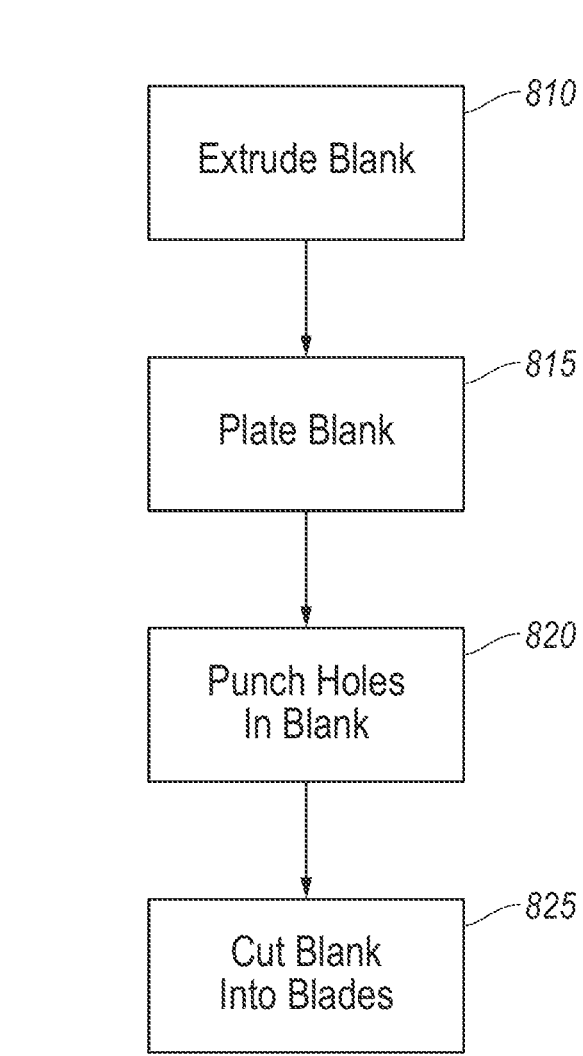
FIG. 8 is a flow chart illustrating a process for manufacturing a blade for the watt-hour meter block adapter assembly.

With reference to FIG. 8, a process for manufacturing the blade 24 is illustrated. The process begins at a step 810 where a blank is extruded with a die having an opening that replicates the top and bottom surfaces 46, 48, e.g., the opening may replicate a 2-dimensional shape of the blade 24, i.e., facing the top surface 46 or the bottom surface 48, e.g., as illustrated in FIG. 4. Extruding the blank with the die having the opening that replicates the top and bottom surfaces 46, 48 increases efficiency of manufacturing, e.g., by reducing or eliminating various steps of conventional manufacturing processes to manufacture a blade (such as pressing and machining) and waste material associated therewith (e.g., machining chips).

The opening of the die may include opposing first and second edges having profiles that replicate a profile of the side surfaces 50 of the blade 24, e.g., at the blade end 26, the jaw end 28, and the middle portion 30. The first and second edges by have curves that form the jogs 56 of the finished blades 24. Extruding the jogs 56 eliminates the need for a high tonnage press to bend the jogs 56 into the blades 24. The first and second edges may be spaced from each other at a distance generally equal to the spacing between the side surfaces 50 of the blade 24, e.g., by the widths W1, W2, W3. The opening may include opposing third and fourth edges that extend from the first edge to the second edge. The third and fourth edges may be spaced from each other at a distance generally equal to the spacing between the distal end surfaces 42, 42 (e.g., the length L) of the blade 24. The blank may be extruded copper.

At a step 815 the blank extruded at the step 810 is platted. For example, the copper extruded blank may be plated with tin. The tin plating may inhibit corrosion of the copper.

At a step 820 holes 54, e.g., for the jaw 52, are punched in the blank. The holes 54 may be punched with a press and punches having diameters equal to those of the holes 54.

At a step 825 the blank is cut into blades 24. For example, the blank may be cut at intervals spaced from each other by distances equal the spacing between the top surface 46 and the bottom surface 48 the blade 24 (e.g. the heights H1, H2, H3).

With regard to the process 800 described herein, it should be understood that, although the steps of such process 800 have been described as occurring according to a certain ordered sequence, such process 800 could be practiced with the described steps performed in an order other than the order described herein. For example, as an alternative to plating the extruded blank before the blades 24 are cut, the extruded blank could be cut into blades 24 and then the cut blades 24 could be plated. It further should be understood that certain steps could be performed simultaneously, that other steps could be added, or that certain steps described herein could be omitted. In other words, the description of the process 800 herein is provided for the purpose of illustrating certain embodiments and should in no way be construed so as to limit the disclosed subject matter.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A watt-hour meter block adapter assembly, comprising:
   a housing;
   a blade supported by the housing;
   the blade includes a blade end and a jaw end;
   the blade includes a middle portion that extends from the blade end to the jaw end;
   the blade at the middle portion, at the jaw end, and at the blade end is a rectangle in cross-section perpendicular to the blade; and
   an area of the rectangle cross-section of the blade at the middle portion is greater than an area of the rectangle cross-section of the blade at the blade end and is greater than an area of the of the rectangle cross-section of the blade at the jaw end.

2. The watt-hour meter block adapter assembly of claim 1, wherein the blade end is spaced from the jaw end along an axis, and a width of the blade at the jaw end is greater than a width of the blade at the blade end, the widths at the jaw end and the blade end extending perpendicular to the axis.

3. The watt-hour meter block adapter assembly of claim 1, wherein a height of the blade at the jaw end is greater than a height of the blade at the blade end, the heights at the jaw end and the blade end extending perpendicular to the axis.

4. The watt-hour meter block adapter assembly of claim 1, wherein the area of the rectangle cross-section of the blade the jaw end is greater than the area of the rectangle cross-section of the blade at the blade end.

5. The watt-hour meter block adapter assembly of claim 1, wherein the jaw end, the blade end, and the middle portion are unitary.

6. The watt-hour meter block adapter assembly of claim 1, wherein a width of the blade at the middle portion is greater than at the blade end and at the jaw end.

7. The watt-hour meter block adapter assembly of claim 6, wherein a height of the blade at the middle portion is greater than a height of the blade at the blade end.

8. The watt-hour meter block adapter assembly of claim 7, wherein the blade includes a jog that connects the blade end and the middle portion.

9. The watt-hour meter block adapter assembly of claim 7, wherein the height of the blade at the middle portion is equal to a height of the blade at the jaw end.

10. The watt-hour meter block adapter assembly of claim 1, wherein a height of the blade at the middle portion is equal to a height of the blade at the blade end.

11. The watt-hour meter block adapter assembly of claim 1, wherein a height of the blade at the jaw end is greater than at the blade end, and wherein a width of the blade at the middle portion is greater than at the blade end, the widths perpendicular to the heights.

12. The watt-hour meter block adapter assembly of claim 11, wherein the blade includes a step that connects the middle portion and the blade end.

13. The watt-hour meter block adapter assembly of claim 1, wherein the blade extends normally from the cross-sections.

\* \* \* \* \*